United States Patent
La Rosa et al.

(10) Patent No.: US 9,941,012 B2
(45) Date of Patent: Apr. 10, 2018

(54) TWIN MEMORY CELL INTERCONNECTION STRUCTURE

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTONICS (ROUSSET) SAS, Rousset (FR)

(*) Notice: Subject to any disclaimer, the term of this patent is extended or adjusted under 35 U.S.C. 154(b) by 0 days.

(21) Appl. No.: 15/453,663

(22) Filed: Mar. 8, 2017

(65) Prior Publication Data

US 2017/0178733 A1  Jun. 22, 2017

Related U.S. Application Data

(63) Continuation of application No. 14/980,853, filed on Dec. 28, 2015, now Pat. No. 9,627,068.

(30) Foreign Application Priority Data

May 11, 2015 (FR) ...................................... 15 54163

(51) Int. Cl.
  *H01L 29/66* (2006.01)
  *G11C 16/26* (2006.01)
  (Continued)

(52) U.S. Cl.
  CPC ............... *G11C 16/26* (2013.01); *G11C 7/18* (2013.01); *G11C 16/0408* (2013.01);
  (Continued)

(58) Field of Classification Search
  CPC ............... G11C 16/0408; G11C 16/26; H01L 21/76816; H01L 21/76897; H01L 23/5226; H01L 23/528
  (Continued)

(56) References Cited

U.S. PATENT DOCUMENTS 6,304,480 B1  10/2001  Schoellkopf
6,432,761 B1  8/2002  Gerber et al.
(Continued)

FOREIGN PATENT DOCUMENTS

EP  1059669 A1  12/2000
FR  3021803 A1  12/2015
JP  H05110108 A  4/1993

OTHER PUBLICATIONS

Takeuchi, K. et al., "A Negative $V_{th}$ Cell Architecture for Highly Scalable, Excellently Noise-Immune, and Highly Reliable NAND Flash Memories," IEEE Journal of Solid-State Circuits, vol. 34, No. 5, May 1999, 10 pgs.

*Primary Examiner* — Richard Elms
*Assistant Examiner* — Xiaochun L Chen
(74) *Attorney, Agent, or Firm* — Seed Intellectual Property Law Group LLP

(57) ABSTRACT

Non-volatile memory including rows and columns of memory cells, the columns of memory cells including pairs of twin memory cells including a common selection gate. According to the disclosure, two bitlines are provided per column of memory cells. The adjacent twin memory cells of the same column are not connected to the same bitline while the adjacent non-twin memory cells of the same column are connected to the same bitline.

20 Claims, 11 Drawing Sheets

(51) Int. Cl.
  *G11C 7/18* (2006.01)
  *G11C 16/04* (2006.01)
  *H01L 27/11519* (2017.01)
  *H01L 27/11524* (2017.01)
  *G11C 16/08* (2006.01)
  *H01L 21/768* (2006.01)
  *H01L 23/522* (2006.01)
  *H01L 23/528* (2006.01)
  *H01L 23/535* (2006.01)
  *H01L 27/11556* (2017.01)
  *H01L 29/423* (2006.01)
  *H01L 27/02* (2006.01)

(52) U.S. Cl.
  CPC .......... *G11C 16/0433* (2013.01); *G11C 16/08* (2013.01); *H01L 21/76816* (2013.01); *H01L 21/76897* (2013.01); *H01L 23/528* (2013.01); *H01L 23/5226* (2013.01); *H01L 23/535* (2013.01); *H01L 27/11519* (2013.01); *H01L 27/11524* (2013.01); *H01L 27/11556* (2013.01); *H01L 29/42324* (2013.01); *H01L 27/0207* (2013.01)

(58) Field of Classification Search
  USPC .................................................... 365/185.18
  See application file for complete search history.

(56) References Cited

U.S. PATENT DOCUMENTS

| | | | |
|---|---|---|---|
| 6,518,126 B2 | 2/2003 | Wu et al. | |
| 6,580,641 B2 | 6/2003 | Wu et al. | |
| 9,076,878 B2* | 7/2015 | La Rosa | H01L 29/788 |
| 2002/0175394 A1 | 11/2002 | Wu et al. | |
| 2003/0086296 A1 | 5/2003 | Wu et al. | |
| 2007/0195595 A1 | 8/2007 | Seo et al. | |
| 2012/0201079 A1 | 8/2012 | Shibata | |
| 2013/0228846 A1 | 9/2013 | La Rosa et al. | |
| 2014/0097481 A1* | 4/2014 | La Rosa | H01L 29/788 257/315 |
| 2015/0348981 A1 | 12/2015 | La Rosa et al. | |
| 2016/0336070 A1 | 11/2016 | La Rosa et al. | |

* cited by examiner

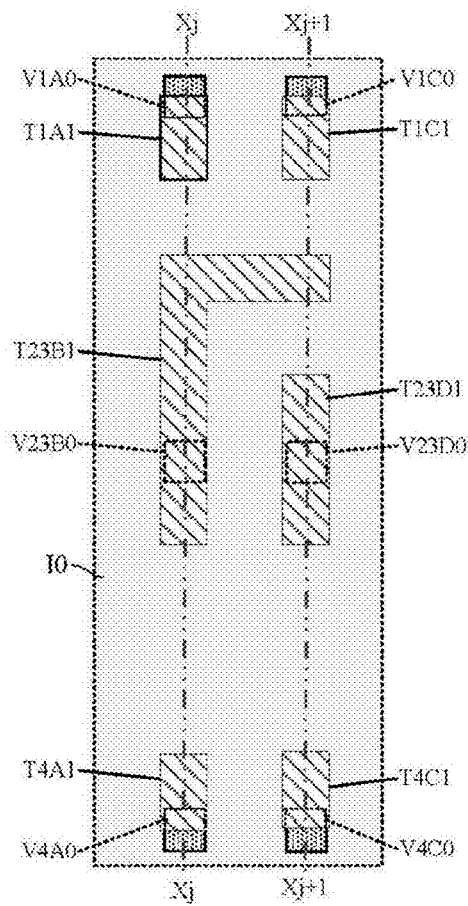
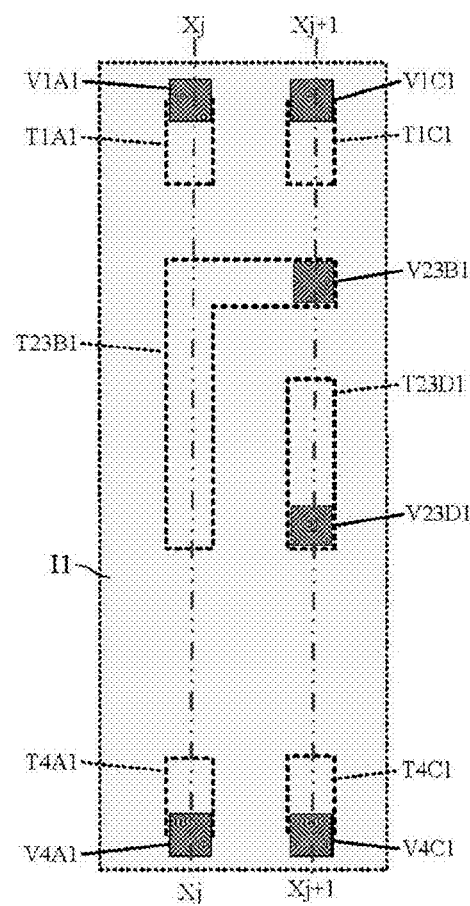
Fig. 9
Fig. 10A
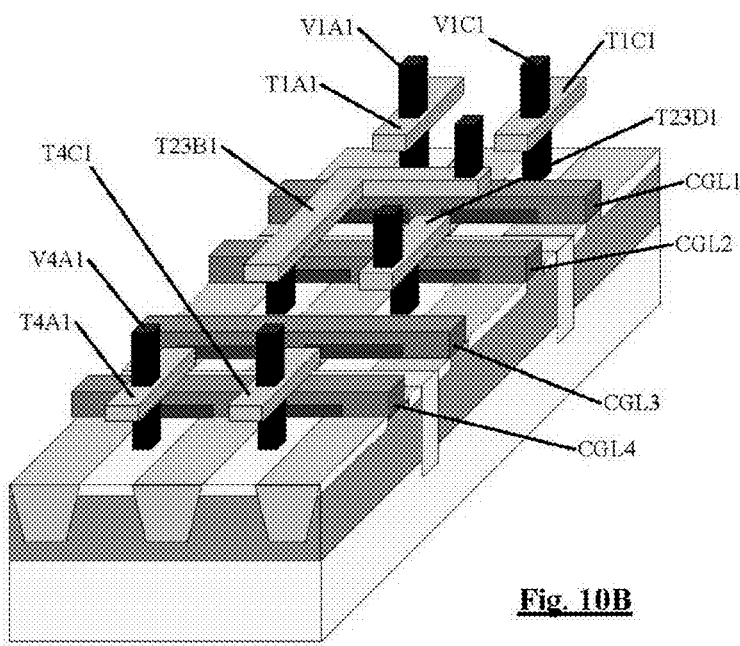
Fig. 10B

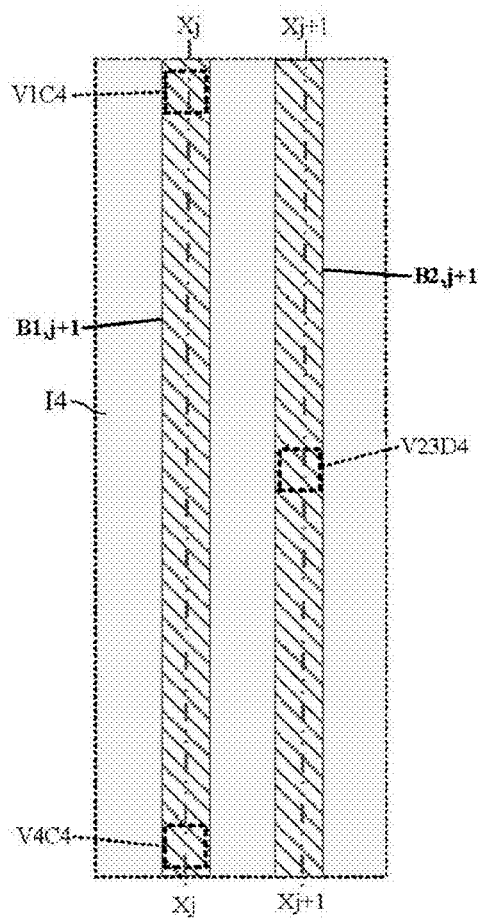
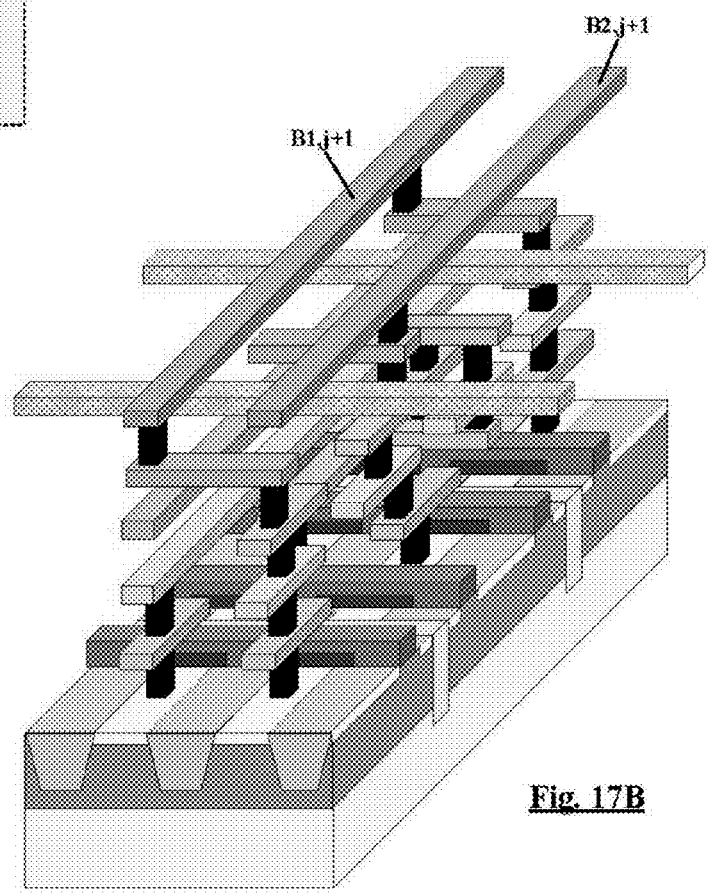
Fig. 17A
Fig. 17B

TWIN MEMORY CELL INTERCONNECTION STRUCTURE

BACKGROUND

Description of the Related Art

FIG. 1 represents a memory plane structure MA0 including memory cells $M_{i,j}$, $M_{i,j+1}$, $M_{i-1,j}$, $M_{i-1,j+1}$ of the type described in US patent application 20130228846. The memory cells $M_{i,j}$, $M_{i,j+1}$ of rank 'i' belong to a physical page $PG_i$ of the memory plane and are connected to a wordline $WL_{i-1,i}$ and to a gate control line $CGL_i$. The memory cells $M_{i-1,j}$, $M_{i-1,j+1}$ of rank 'i-1' belong to a physical page $PG_{i-1}$ of rank 'i-1' of the memory plane and are connected to the wordline $WL_{i-1,i}$ and to a gate control line $CGL_{i-1}$. The memory cells $M_{i,j}$ of rank 'j' are accessible in reading and writing via a bitline $B_j$ and the memory cells $M_{i,j+1}$, $M_{i-1,j+1}$ of rank 'j-1' are accessible in reading and writing via a bitline $B_{j+1}$.

Each memory cell includes a floating gate transistor (FG), respectively $T_{i,j}$, $T_{i,j+1}$, $T_{i-1,j}$, $T_{i-1,j+1}$. The drain (D) regions of the transistors $T_{i,j}$, $T_{i-1,j}$, are connected to the bitline $B_j$ and the drain terminals of the transistors $T_{i,k+1}$, $T_{i-1,j+1}$ are connected to the bitline $B_{j+1}$. The control gates CG of the transistors $T_{i,j}$, $T_{i,j+1}$ are connected to the gate control line $CGL_i$ and the control gates CG of the floating gate transistors $T_{i-1,j}$, $T_{i-1,j+1}$ are connected to the gate control line $CGL_{i-1}$.

Each floating gate transistor has its source (S) terminal connected to a source line SL via a selection transistor ST. The selection transistors ST of the memory cells $M_{i,j}$ and $M_{i-1,j}$ have a common selection gate CSG and the two memory cells are accordingly termed 'twins'. Similarly, memory cells $M_{i,j+1}$ and $M_{i-1,j+1}$ are twin memory cells and their selection transistors ST have a common selection gate CSG. Each selection gate CSG is a vertical gate buried in a substrate in which the memory plane MA0 is implanted, the source line SL also being buried. These common selection gates CSG of twin memory cells, are connected to the wordline $WL_{i-1,i}$.

Such memory cells may be erased or programmed via the channel, i.e., by bringing the substrate to a positive erasure or negative programming voltage causing the extraction of electrical charges from their floating gates or the injection of electrical charges into their floating gates, through the Fowler-Nordheim effect. More particularly, erasing a memory cell is performed by combining the positive voltage applied to the substrate with a negative voltage applied to the control gate of its floating gate transistor, while the control gate of the twin memory cell's floating gate transistor receives a positive erasure inhibiting voltage for preventing it from being simultaneously erased. Similarly, programming a memory cell may be performed by combining a negative voltage applied to the bitline concerned and to the substrate, with a positive voltage applied to the control gate of its floating gate transistor, while the control gate of the twin memory cell's floating gate transistor receives a negative programming inhibiting voltage for preventing it from being simultaneously programmed. The memory cells may also be programmed by hot electron injection, by causing a current to flow in the bitlines.

Finally, a memory cell is read by applying a positive voltage to the control gate CG of its floating gate transistor, as well as a positive voltage to the corresponding bitline, while the twin memory cell, which is connected to the same bitline, receives on its control gate a negative reading inhibiting voltage for preventing it from being simultaneously read (FIG. 9 of the aforementioned application).

This conventional memory plane structure including twin memory cells therefore needs to provide a wordline decoder capable of applying a positive reading voltage to a memory cell that has to be read, while applying a negative reading inhibiting voltage to its twin memory cell.

An improvement to this memory plane structure and twin memory cells could be wanted that makes it possible to read a memory cell without applying a negative reading inhibiting voltage to the twin memory cell.

BRIEF SUMMARY

Embodiments of the disclosure relate to a non-volatile memory on a semiconductor substrate, including rows and columns of memory cells, the columns of memory cells including pairs of twin memory cells each including a floating gate transistor and a selection transistor including a selection gate common to the selection transistor of the twin memory cell, bitlines each connected to conducting terminals of floating gate transistors of the same column of memory cells, gate control lines transverse to the bitlines, connected to control gates of floating gate transistors of the same row, and two bitlines per column of memory cells, and in which two adjacent twin memory cells of the same column are not connected to the same bitline while two adjacent non-twin memory cells of the same column are connected to the same bitline.

According to one embodiment, the memory includes, for two adjacent columns of memory cells, three bitlines arranged and superimposed above a first column of memory cells on three different interconnection levels and a fourth bitline arranged above a second column of memory cells.

According to one embodiment, the memory includes a first bitline aligned on a first bitline axis extending above a first column of memory cells, and connected to the floating gate transistors of the first column by a first conductive path including vias passing through isolating layers and sections of conductive lines arranged on the isolating layers, a second bitline aligned on the first bitline axis, and connected to floating gate transistors of the first column by a second conductive path including vias passing through isolating layers and sections of conductive lines arranged on the isolating layers, a third bitline aligned on the first bitline axis, and connected to floating gate transistors of a second column of memory cells by a third conductive path including vias passing through isolating layers and sections of conductive lines arranged on the isolating layers, and a fourth bitline aligned on a second bitline axis extending above the second column of memory cells, and connected to floating gate transistors by a fourth conductive path including vias passing through isolating layers and sections of conductive lines arranged on the isolating layers.

According to one embodiment, the memory includes first, second, third, fourth and fifth isolating layers, the first bitline extends over the second isolating layer, the second bitline extends over the third isolating layer, the third bitline extends over the fifth isolating layer, and the fourth bitline extends over the fifth isolating layer.

According to one embodiment, the first conductive path includes a via aligned on the first bitline axis, passing through the first isolating layer, a section of conductive line aligned on the first bitline axis, arranged on the first isolating layer, and a via aligned on the first bitline axis, passing through the second isolating layer.

According to one embodiment, the second conductive path includes a via aligned on the first bitline axis, passing through the first isolating layer, a section of conductive line extending from the first bitline axis up to the second bitline axis, arranged on the first isolating layer, a via aligned on the second bitline axis, passing through the second isolating layer, a section of conductive line aligned on the second bitline axis, arranged on the second isolating layer, a via aligned on the second bitline axis, passing through a third isolating layer, and a section of conductive line extending from the second bitline axis up to the first bitline axis, arranged on the third isolating layer.

According to one embodiment, the third conductive path includes a via aligned on the second bitline axis, passing through the first isolating layer, a section of conductive line aligned on the first bitline axis, arranged on the first isolating layer, a via aligned on the first bitline axis, passing through the second isolating layer, a section of conductive line aligned on the second bitline axis, arranged on the second isolating layer, a via aligned on the second bitline axis, passing through the third isolating layer, a section of conductive line aligned on the second bitline axis, arranged on the third isolating layer, a via aligned on the second bitline axis, passing through the fourth isolating layer, a section of conductive line extending from the second bitline axis up to the first bitline axis, arranged on the fourth isolating layer, and a via aligned on the first bitline axis, passing through a fifth isolating layer.

According to one embodiment, the fourth conductive path includes a via aligned on the second bitline axis, passing through the first isolating layer, a section of conductive line aligned on the first bitline axis, arranged on the first isolating layer, a via aligned on the first bitline axis, passing through the second isolating layer, a section of conductive line aligned on the second bitline axis, arranged on the second isolating layer, a via aligned on the second bitline axis, passing through the third isolating layer, a section of conductive line aligned on the second bitline axis, arranged on the third isolating layer, a via aligned on the second bitline axis, passing through the fourth isolating layer, a section of conductive line arranged on the fourth isolating layer, and a via aligned on the second bitline axis, passing through a fifth isolating layer.

According to one embodiment, the memory includes reading circuits and a column decoder configured for reading the memory cells of the same column through one of the two bitlines assigned to the column.

Embodiments of the disclosure also relate to a method of fabricating a non-volatile memory on a semiconductor substrate, the memory including pairs of twin memory cells each including a floating gate transistor and a selection transistor including a selection gate common to the selection transistor of the twin memory cell, the method including the steps consisting of producing a first and a second column of memory cells each including pairs of twin memory cells, producing a first bitline aligned on a first bitline axis extending above the first column of memory cells, and connected to floating gate transistors of non-twin memory cells of the first column by a first conductive path including vias passing through isolating layers and sections of conductive lines arranged on the isolating layers, producing a second bitline aligned on the first bitline axis, and connected to floating gate transistors of other non-twin memory cells of the first column by a second conductive path including vias passing through isolating layers and sections of conductive lines arranged on the isolating layers, producing a third bitline aligned on the first bitline axis, and connected to floating gate transistors of non-twin memory cells of the second column by a third conductive path including vias passing through isolating layers and sections of conductive lines arranged on the isolating layers, and producing a fourth bitline aligned on a second bitline axis extending above the second column of memory cells, and connected to floating gate transistors of other non-twin memory cells of the second column by a fourth conductive path including vias passing through isolating layers and sections of conductive lines arranged on the isolating layers.

According to one embodiment, the method includes the steps consisting of producing first, second, third, fourth and fifth isolating layers, producing the first bitline on the second isolating layer, producing the second bitline on the third isolating layer, producing the third bitline on the fifth isolating layer, and producing the fourth bitline on the fifth isolating layer.

According to one embodiment, steps of producing the first conductive path include producing a via aligned on the first bitline axis, passing through a first isolating layer, producing a section of conductive line aligned on the first bitline axis, arranged on the first isolating layer, and producing a via aligned on the first bitline axis, passing through a second isolating layer.

According to one embodiment, steps of producing the second conductive path include producing a via aligned on the first bitline axis, passing through a first isolating layer, producing a section of conductive line extending from the first bitline axis up to the second bitline axis, arranged on the first isolating layer, producing a via aligned on the second bitline axis, passing through a second isolating layer, producing a section of conductive line aligned on the second bitline axis, arranged on the second isolating layer, producing a via aligned on the second bitline axis, passing through a third isolating layer, and producing a section of conductive line extending from the second bitline axis up to the first bitline axis, arranged on the third isolating layer.

According to one embodiment, steps of producing the third conductive path include producing a via aligned on the second bitline axis, passing through a first isolating layer, producing a section of conductive line aligned on the first bitline axis, arranged on the first isolating layer, producing a via aligned on the first bitline axis, passing through a second isolating layer, producing a section of conductive line aligned on the second bitline axis, arranged on the second isolating layer, producing a via aligned on the second bitline axis, passing through a third isolating layer, producing a section of conductive line aligned on the second bitline axis, arranged on the third isolating layer, producing a via aligned on the second bitline axis, passing through a fourth isolating layer, producing a section of conductive line extending from the second bitline axis up to the first bitline axis, arranged on the fourth isolating layer, and producing a via aligned on the first bitline axis, passing through a fifth isolating layer.

According to one embodiment, steps of producing the fourth conductive path include producing a via aligned on the second bitline axis, passing through a first isolating layer, producing a section of conductive line aligned on the first bitline axis, arranged on the first isolating layer, producing a via aligned on the first bitline axis, passing through a second isolating layer, producing a section of conductive line aligned on the second bitline axis, arranged on the second isolating layer, producing a via aligned on the second bitline axis, passing through a third isolating layer, producing a section of conductive line aligned on the second bitline axis, arranged on the third isolating layer, producing a via aligned on the second bitline axis, passing through a fourth isolating layer, producing a section of conductive line arranged on the fourth isolating layer, and producing a via aligned on the second bitline axis, passing through a fifth isolating layer.

BRIEF DESCRIPTION OF THE SEVERAL VIEWS OF THE DRAWINGS

Embodiments of a memory plane structure, of memory cells and of a method of fabricating such a memory plane structure and memory cells will be described in what follows by referring non-restrictively to the accompanying figures in which:

FIGS. 8A, 9, 10A, 11, 12A, 13, 14A, 15, 16A, 17A are top views of the semiconductor substrate showing other steps in the method of fabricating twin memory cells, FIGS. 8B, 10B, 12B, 14B, 16B, 17B are perspective views corresponding to the top views of FIGS. 8A, 10A, 12A, 14A, 16A, 17A.

DETAILED DESCRIPTION

Figure 1:
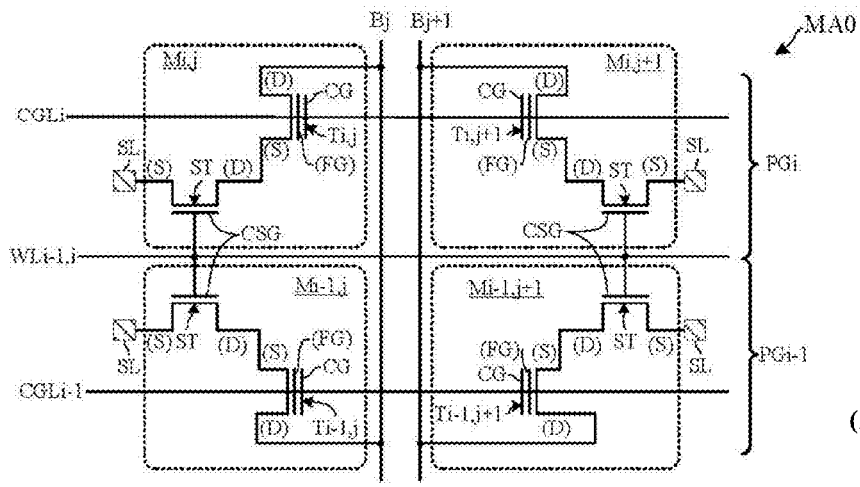
FIG. 1 previously described is the electrical diagram of a conventional memory plane structure and twin memory cells.
Figure 2:
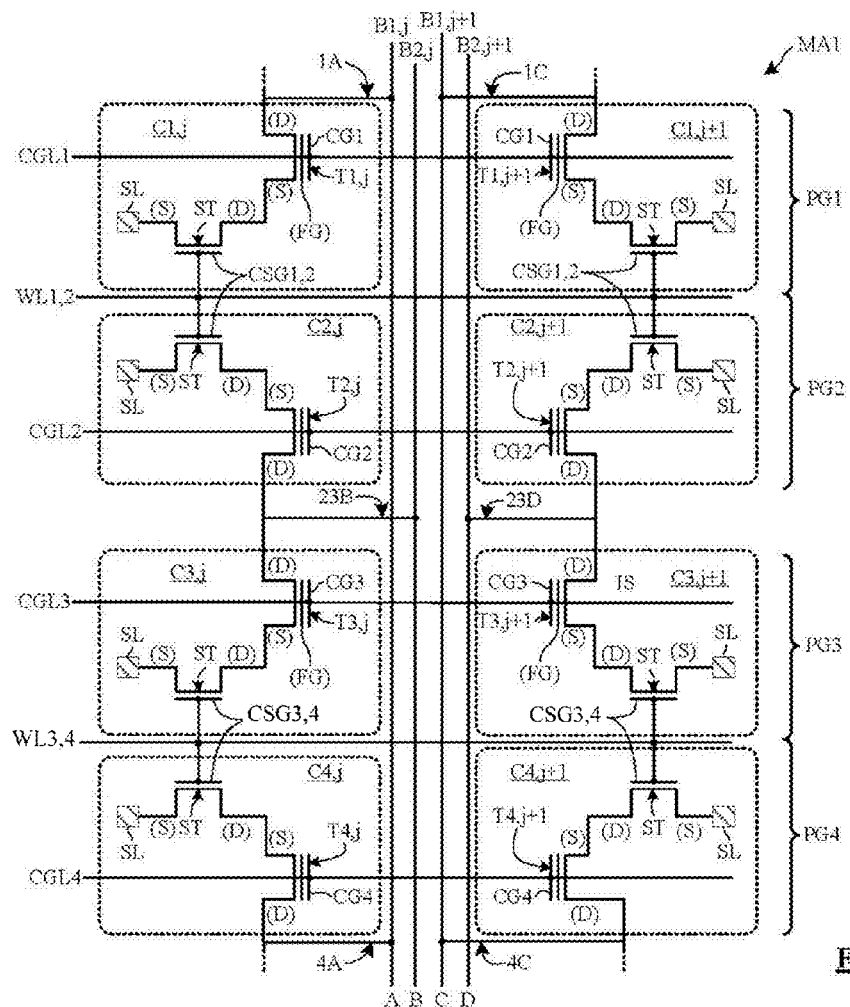
FIG. 2 is the electrical diagram of an embodiment of a memory plane including twin memory cells binoculars according to the disclosure.

FIG. 2 is the electrical diagram of an embodiment of a memory plane MA1 according to the disclosure, implanted in a semiconductor substrate. The memory plane includes rows and columns of memory cells, eight memory cells C1,j, C2,j, C3,j, C4,j, C1,j+1, C2,j+1, C3,j+1, C4,j+1 being represented here. Each memory cell includes a floating gate transistor (FG), T1,j, T2,j, T3,j, T4,j, T1,j+1, T2,j+1, T3,j+1, T4,j+1, respectively and a selection transistor ST of which the drain (D) terminal is connected to the source (S) terminal of the floating gate transistor.

The memory cells C1,j, C2,j, C3,j, C4,j belong to a column of rank j and the memory cells C1,j+1, C2,j+1, C3,j+1, C4,j+1 belong to an adjacent column of rank j+1. The memory cells C1,j, C1,j+1 belong to a first row of memory cells, or physical page PG1, and their floating gate transistors T1,j, T1,j+1 have control gates CG1 connected to a common gate control line CGL1. The memory cells C2,j, C2,j+1 belong to a second row of memory cells, or physical page PG2, and their floating gate transistors T2,j, T2,j+1 have control gates CG2 connected to a common gate control line CGL2. The memory cells C3,j, C3,j+1 belong to a third row of memory cells, or physical page PG3, and their floating gate transistors T3,j, T3,j+1 have control gates CG3 connected to a common gate control line CGL3. The memory cells C4,j, C4,j+1 belong to a fourth row of memory cells, or physical page PG4, and their floating gate transistors T4,j, T4,j+1 have control gates CG4 connected to a common gate control line CGL4.

In the column of rank j, the memory cells C1,j, C2,j are twin memory cells and their selection transistors ST include a common selection gate CSG1,2 connected to a common wordline WL1,2. Similarly, the memory cells C3,j, C4,j are twin memory cells and their selection transistors ST include a common selection gate CSG3,4 connected to a common wordline WL3,4. In the column of rank j+1, the memory cells C1,j+1, C2,j+1 are twin memory cells and their selection transistors ST include a common selection gate CSG1,2 connected to the common wordline WL1,2. The memory cells C3,j+1, C4,j+1 are twin memory cells and their selection transistors ST include a common selection gate CSG3,4 connected to the wordline WL3,4. The common selection gates CSG1,2 or CSG3,4 of the pairs of twin memory cells are buried vertical gates produced in the form of conductive trenches made in the substrate, and the source (S) terminals of the selection transistors ST are connected to a buried source plane SL, extending under the region of the substrate where the memory cells are implanted.

According to a first aspect of the disclosure, the memory plane MA1 includes two bitlines per column of memory cells. Thus, two bitlines B1,j, B2,j are assigned to the memory cells of the column of rank j, and two bitlines B1,j+1, B2,j+1 are assigned to the memory cells of the column of rank j+1. Still according to this aspect of the disclosure, two twin memory cells are connected to different bitlines from the two bitlines assigned to the column in which they are located, while two adjacent but non-twin memory cells are connected to the same bitline.

Thus, in the column of rank j:

the drain (D) terminal of the floating gate transistor T1,j is connected to the bitline B1,j via a conductive path 1A, the drain terminal of the floating gate transistor T2,j is connected to the bitline B2,j via a conductive path 23B, the drain terminal of the floating gate transistor T3,j is connected to the bitline B2,j via the conductive path 23B (the memory cell C2,j being adjacent but not twin to the memory cell C3,j), and the drain terminal of the floating gate transistor T4,j is connected to the bitline B1,j via a conductive path 4A.

In the column of rank j+1:

the drain terminal of the floating gate transistor T1,j+1 is connected to the bitline B1,j+1 via a conductive path 1C, the drain terminal of the floating gate transistor T2,j+1 is connected to the bitline B2,j+1 via a conductive path 23D, the drain terminal of the floating gate transistor T3,j+1 is connected to the bitline B2,j+1 via the conductive path 23D (the memory cell C2,j+1 being adjacent but not twin to the memory cell C3,j+1), and the drain terminal of the floating gate transistor T4,j+1 is connected to the bitline B1,j+1 via a conductive path 4C.

Each memory cell may thus be read independently of its twin memory cell by means of the bitline to which it is connected and to which its twin memory cell is not connected. For example, after selecting the twin memory cells C1,j, C2,j by means of a selection voltage applied to the wordline WL1,2, and after having applied a reading voltage to gate control line CGL1, the memory cell C1,j may be read via the bitline B1,j without it being necessary to apply a negative reading inhibiting voltage to the gate control line CGL2 of the twin memory cell C2,j since this memory cell is not connected to the bitline B1,j but to the bitline B2,j.

The provision of such twin memory cells having a buried common selection gate offers the advantage of considerably reducing the semiconductor surface occupied by the memory cells, so that the minimum distance between two columns of memory cells is no longer determined by the constraints of their method of fabrication but by the constraints of the method of fabrication of the bitlines. Thus, it is the bitlines and the tolerances of their method of fabrication that impose the distance between two columns of memory cells and therefore determine, in a general way, the space requirement of the memory plane.

More particularly, the bitlines are produced in the form of conductive tracks arranged side-by-side on an electrically isolating layer deposited on the memory cells, and are connected thereto by vertical electrical contacts called 'vias' passing through the isolating layer. The distance between two conductive tracks and the minimum width of a conductive track are parameters imposed by the tolerances of the method of fabrication (for avoiding short circuits between adjacent bitlines) and determine the minimum width of the columns of memory cells. By way of example, with the '90 nanometer (channel width of a transistor) microelectronics sector, a bitline produced in the form of an aluminium conductive track may typically present a width of the order of 120 nm and the minimum distance between two bitlines is of the order of 120 nm, so that the minimum width of a column of memory cells is typically of the order of 240 nm.

With a conventional method of fabrication, the provision of two bitlines per column of memory cells therefore involves doubling the width of each column of memory cells, which is undesirable despite the advantage that the two bitlines offer in terms of simplifying the process of reading memory cells.

Thus, a second aspect of the disclosure relates to a method of fabrication of the memory plane MA1 for producing two bitlines per column without increasing the width of the columns of memory cells.

One embodiment of this method will be described in what follows by taking as an example the production of the eight memory cells $C1,j$ to $C4,j+1$ in FIG. 2 and the four corresponding bitlines $B1,j$ to $B2,j+1$. More particularly, steps in fabricating these memory cells will be described in relation to FIGS. 3 to 7 and steps in fabricating bitlines $B1,j$ to, $B2,j+1$ will be described in relation to FIGS. 8A to 17B.

Figure 3:
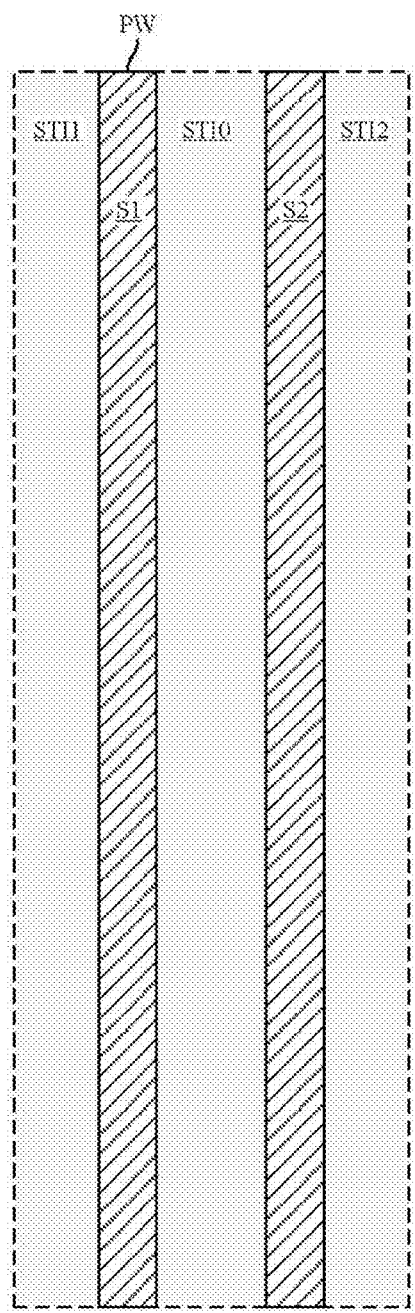
FIGS. 3 to 7 are top views of a semiconductor substrate showing steps of a method of fabricating twin memory cells.

FIG. 3 shows a preliminary step of forming, in a semiconductor substrate PW, three longitudinal STI (Shallow Trench Isolation) type isolation trenches STI0, STI1, STI2 which delimit two substrate strips S1, S2 in which the memory cells will be created. This step is preceded by a step of implanting in the substrate a doped buried layer forming a source plane SL (not visible in the figure) or of implanting multiple interconnected source lines SL. A source plane is generally preferred to source lines if it is planned to erase the memory cells by hot electron injection.

Figure 4:
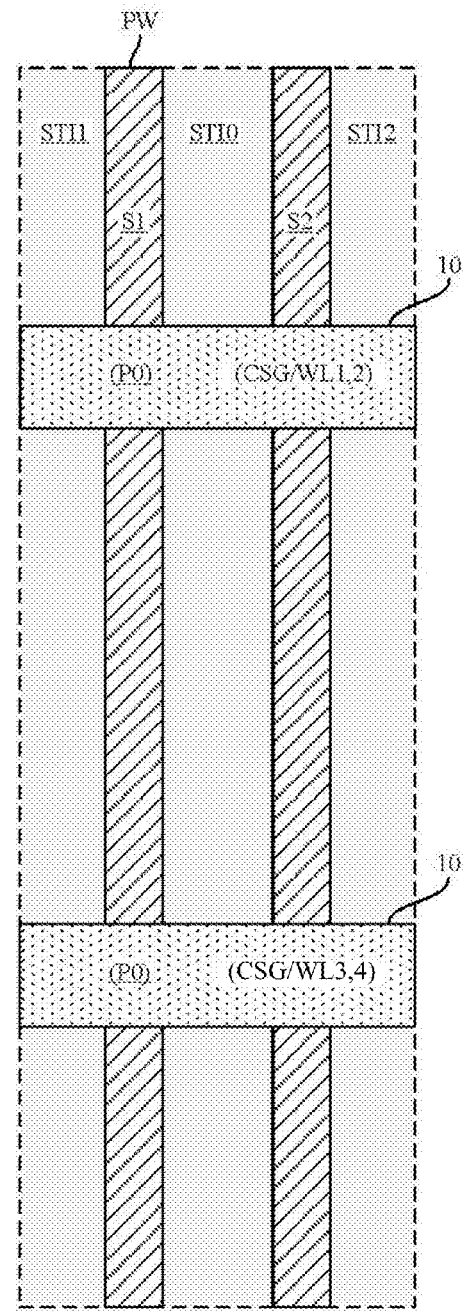

During a step illustrated in FIG. 4, two conductive trenches are formed transversely to the substrate strips S1, S2, by etching the substrate, depositing a dielectric layer (not visible) then depositing a layer of polysilicon P0 (polycrystalline silicon) and etching the latter until only the conductive trenches P0 remain. Each conductive trench is intended to form both the wordline WL1,2, WL3,4 and the selection gates CSG of the selection transistors ST of the memory cells.

Figure 5:
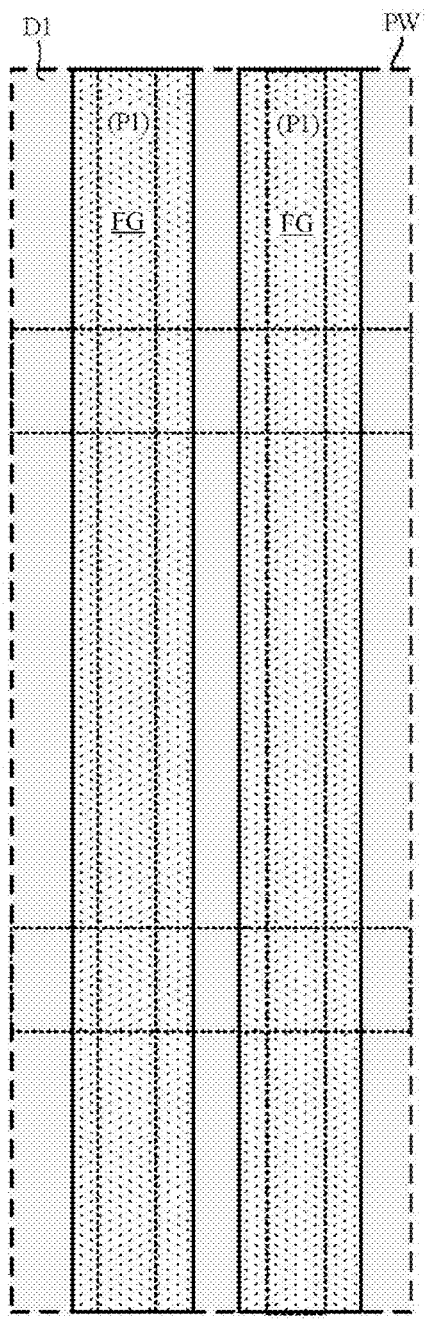

During a step illustrated in FIG. 5, a tunnel dielectric layer D1 is deposited on the substrate PW, then two strips of polysilicon P1, intended to form floating gates FG, are formed on the layer D1 above the substrate strips S1, S2 by etching a polysilicon layer.

Figure 6:
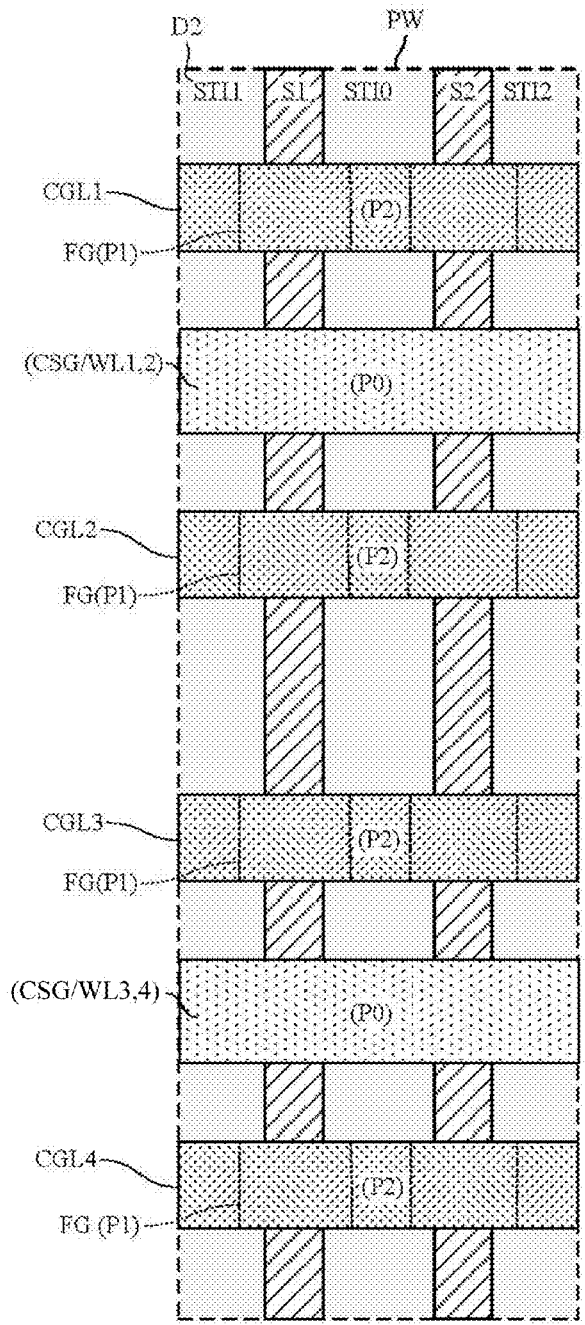

During a step the result of which is illustrated in FIG. 6, a dielectric layer D2 is deposited on the substrate and on the polysilicon strips P1, then a polysilicon layer is deposited on the layer D2. The polysilicon layer is then etched with the layer D2 and the strips P1 to obtain transverse polysilicon strips P2 covering portions of residual strips P1. The strips P2 are intended to form the gate control lines CGL1, CGL2, CGL3, CGL4 of the floating gate transistors and the portions of strips P1 are intended to form the floating gates FG.

Figure 7:
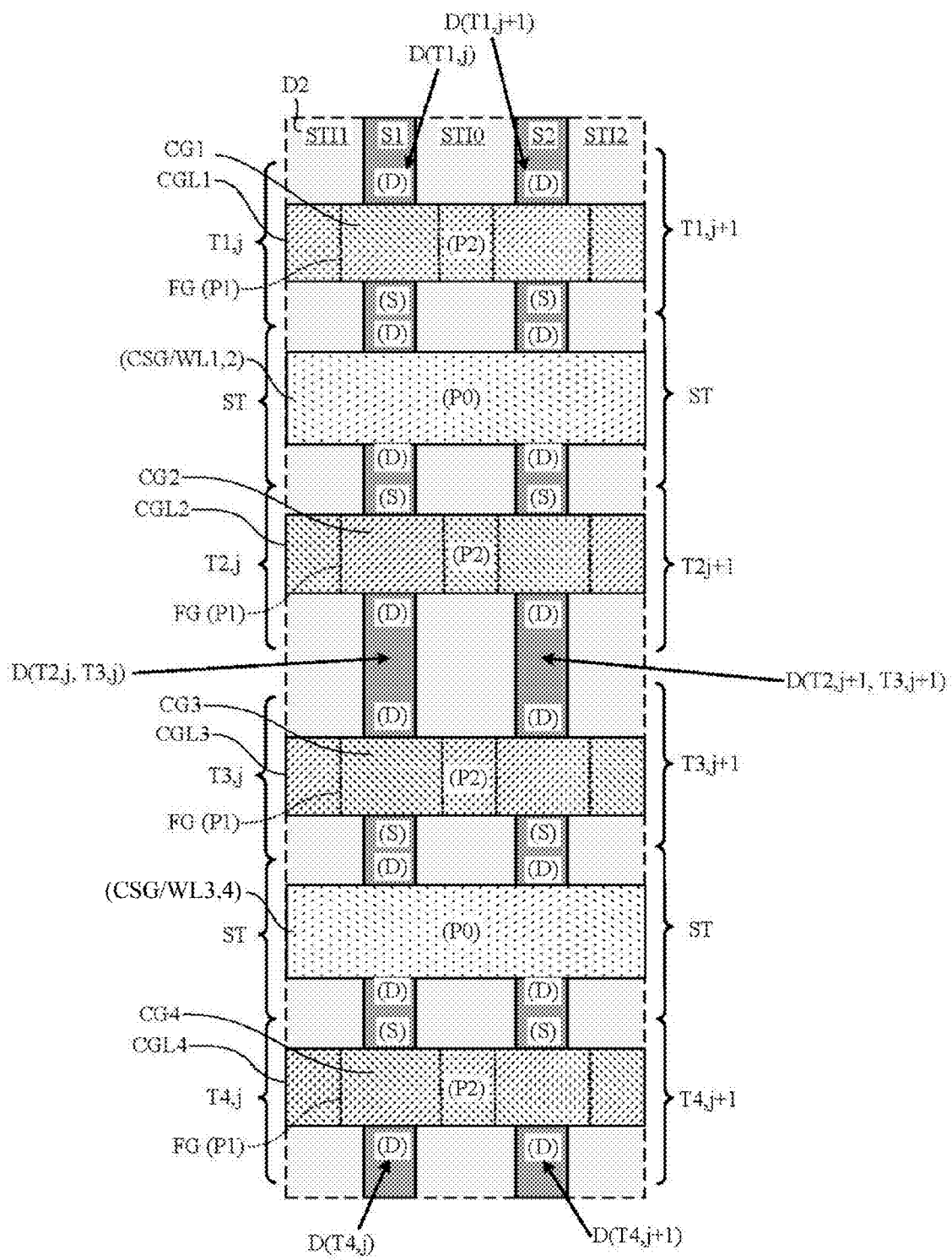

During a step illustrated in FIG. 7, the substrate strips S1, S2 are doped by self-aligned implanting of dopants on the gate control lines CGL1 to CGL4. This step reveals the drain (D) regions of the selection transistors ST and the drain (D) and source (S) regions of the floating gate transistors $T1,j$ to $T4,j+1$, and more particularly:

a drain region $D(T1,j)$ of the transistor $T1,j$,
a common drain region $D(T2,j, T3,j)$ of the transistors $T2,j, T3,j$,
a drain region $D(T4,j)$ of the transistor $T4,j$,
a drain region $D(T1,j+1)$ of the transistor $T1,j+1$,
a common drain region $D(T2,j+1, T3,j+1)$ of the transistors $T2,j+1$,
$T3,j+1$, and
a drain region $D(T4,j+1)$ of the transistor $T4,j$.

The regions of the gate control lines CGL1 to CGL4 extending between these drain and source regions form the control gates CG1 to CG4 of the floating gate transistors, and the portions of strips P1 extending under the control gates CG1 to CG4 form the floating gates FG of the transistors. The conductive trenches P0 form the wordlines WL1,2, WL3,4 and the selection gates CSG of the selection transistors ST of the memory cells.

It will be noted that the portion of memory plane in production, as shown in FIG. 7, here forms a 'building block' of the memory plane, that is to say the smallest unit for implementing the method of fabricating bitlines that will be described. This building block is in practice produced together with other building blocks which extend on the right and left sides, above and below (in the plane of FIG. 7) the building block. Thus, the drain regions $D(T2,j, T3,j)$ and $D(T2,j+1, T3,j+1)$ are not the only drain regions common to two floating gate transistors. Each drain region $D(T1,j), D(T1,j+1)$ is also a drain region common to another floating gate transistor belonging to an adjacent building block located above the building block represented, and each drain region $D(T4,j), D(T4,j+1)$ is a drain region common to another floating gate transistor belonging to an adjacent building block located below the building block represented.

Steps in producing the bitlines $B1,j, B1,j+1, B2,j, B2,j+1$ above the building block will be now described in relation to Table 1 in the Annex, which forms an integral part of the description, and with reference to FIGS. 8A to 17B. These steps include steps of depositing dielectric layers, forming vias in the dielectric layers, then of forming sections of conductive tracks on the dielectric layers and above the vias, and so on until the bitlines are obtained. The conductive tracks may be formed by etching a layer of metal or by the technique of chemical and mechanical polishing (CMP) of a layer of metal. The CMP technique requires previously creating in the dielectric support layer trenches corresponding to the conductive tracks, which are then filled with a conductive material, e.g., aluminium, by depositing a conductive layer on the dielectric layer. The conductive layer is then polished until only the conductive tracks in the trenches are retained.

The following references, chosen in relation to those appearing in FIG. 2, will be used:
A=bitline $B1,j$,
B=bitline $B2,j$,
C=bitline $B1,j+1$,
D=bitline $B2,j+1$,
A=conductive path linking the drain region of transistor $T1,j$ to bitline A,
23B=conductive path between the drain regions of transistors $T2,j, T3,j$ and bitline B, 4A=conductive path linking the drain region of transistor T4,j to bitline A, 1C=conductive path linking the drain region of transistor T1,j+1 to bitline C, 23D=conductive path between the drain regions of transistors T2,j+1, T3,j+1 and bitline D, 4C=conductive path linking the drain region of transistor T4,j+1 to bitline C, V1Ax=level 'x' via forming part of the conductive path 1A, V23Bx=level 'x' via forming part of the conductive path 23B, V4Ax=level 'x' via forming part of the conductive path 4A, V1Cx=level 'x' via forming part of the conductive path 1C, V23Dx=level 'x' via forming part of the conductive path 23D, V4Cx=level 'x' via forming part of the conductive path 4C.

T1Ax=level 'x' track section forming part of the conductive path 1A,

T23Bx=level 'x' track section forming part of the conductive path 23B,

T4Ax=level 'x' track section forming part of the conductive path 4A,

T1Cx=level 'x' track section forming part of the conductive path 1C,

T23Dx=level 'x' track section forming part of the conductive path 23D,

T4Cx=level 'x' track section forming part of the conductive path 4C.

Figure 8A:
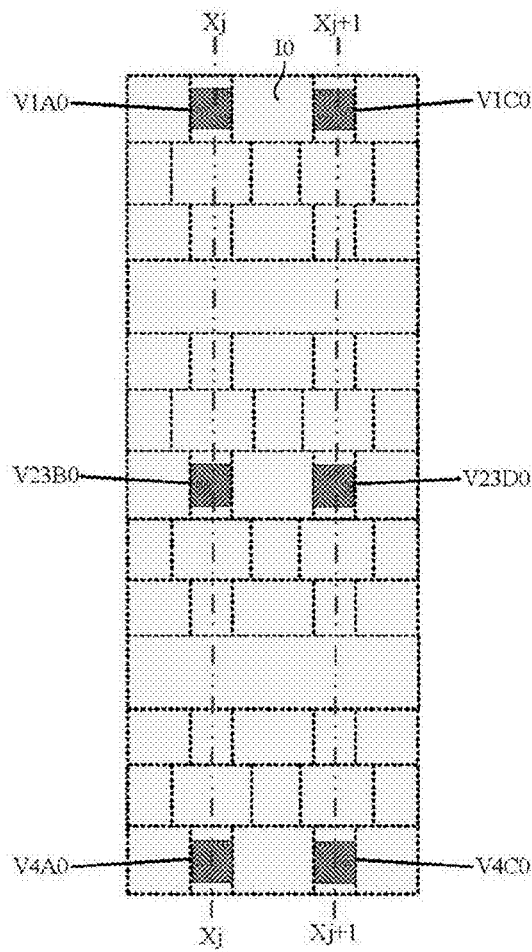

During a step E1 shown in FIG. 8A, a dielectric layer I0 is deposited on the substrate, and the level 0 vias mentioned in Table 1 are made in the layer I0. The locations of the vias relative to the drain regions of the floating gate transistors are described in Table 1, two elements appearing in the same column of Table 1 and in two consecutive lines being superimposed and in electrical contact. The via V1A0 is therefore made above the drain region D(T1,j), the via V23B0 made above the drain region D(T2,j, T3,j), the via V4A0 made above the drain region D(T4,j), the via V1C0 made above the drain region D(T1,j+1), the via V23D0 made above the drain region D(T2,j+1, T3,j+1) and the via V4C0 made above the drain region D(T4,j+1). It is to be noted that the end vias VIA0, V1C0 and V4A0, VAC0 of the building block are also end vias of building blocks located above and below the building block represented, and are therefore shared with the adjacent upper and lower building blocks.

As seen in FIG. 8A, the vias are arranged along two bitline axes Xj and Xj+1 which extend respectively above the doped substrate strip S1 and above the doped substrate strip S2. Here, the vias V1A0, V23B0, V4A0 are aligned on the bitline axis Xj and the vias V1C0, V23D0, V4C0 are aligned on the bitline axis Xj+1. Table 1 includes columns 'Xj' and 'Xj+1' which show the alignment of each element relative to these axes, an element mentioned in a column 'Xj' being aligned on the axis Xj and an element mentioned in a column Xj+1 being aligned on the axis Xj+1.

Figure 8B:
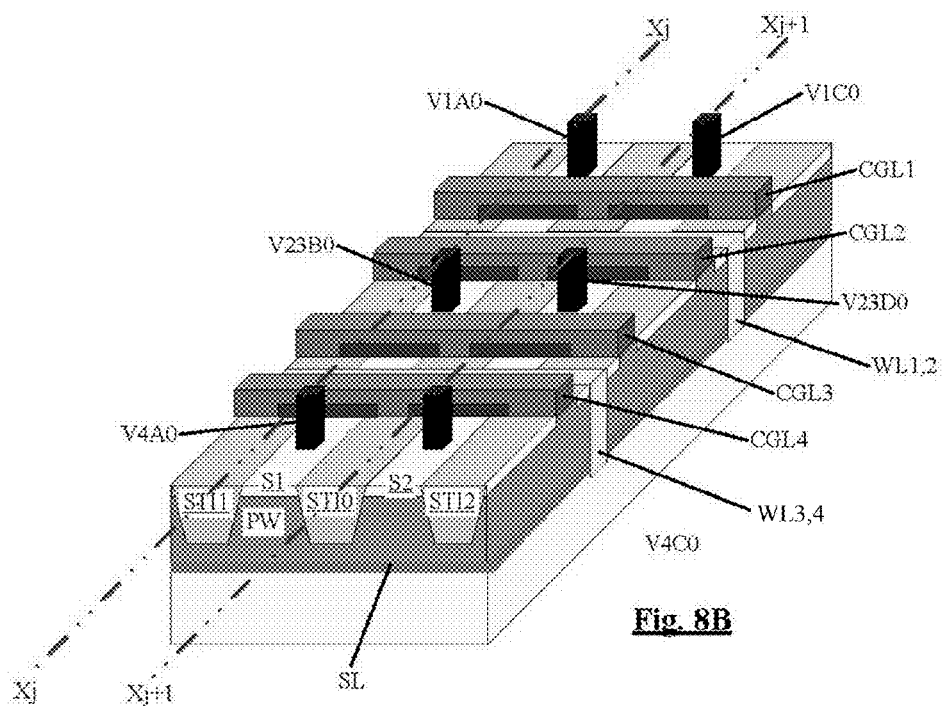

FIG. 8B is a schematic view in perspective and in section of the substrate showing the memory cells at this stage of their fabrication. It shows the substrate PW, which extends above the doped buried layer SL forming the source plane, the isolation trenches STI0, STI1, STI2 made in the substrate PW, the longitudinal strips of doped substrate S1, S2 forming the drain and source regions of the floating gate transistors and the drain regions of the selection transistors, the transverse buried conductive trenches forming the wordlines WL1,2, WL3,4 and the gates of the memory cell selection transistors, the transverse polysilicon strips CGL1, CGL2, CGL3, CGL4 forming the gate control lines and the control gates of the floating gate transistors, and the vias V1A0, V23B0, V4A0, V1C0, V23D0, V4C0 aligned on the axes Xj, Xj+1. The dielectric layer I0 is not represented for the sake of visibility of the other elements represented.

During a step E2 illustrated in FIG. 9, a metal layer M1 ('metal 1') is deposited on the dielectric layer I0 then is etched or chemically and mechanically polished to obtain the sections of conductive tracks of level M1 mentioned in Table 1. Each section of conductive track extends above the level 0 via which is mentioned in Table 1. The section of conductive track T23B1 has a longitudinal part aligned on the axis Xj and a transverse part which joins the axis Xj+1, and thus makes a 'routing jump' from the axis Xj to the axis Xj+1. The section T23B1 appears, therefore, both in the column 'Xj' and in the column 'Xj+1' of Table 1.

During a step E3 illustrated in FIG. 10A, a dielectric layer I1 is deposited on the substrate and the level 1 vias mentioned in Table 1 are made in the layer I1. Each via extends above the section of conductive track of level M1 which is mentioned in Table 1. The position of the via relative to the axes Xj, Xj+1, that is to say aligned on the axis Xj or on the axis Xj+1 is as previously given in Table 1 by referring to the column 'Xj' or 'Xj+1' in which the via is mentioned.

FIG. 10B is a schematic view in perspective and in section of the substrate showing the vias made in step E3 and the sections of tracks made in step E2 as well as the vias made in step E1. The dielectric layers I0, I1 are not represented for the sake of visibility of the other elements represented.

Figures 11, 12A:
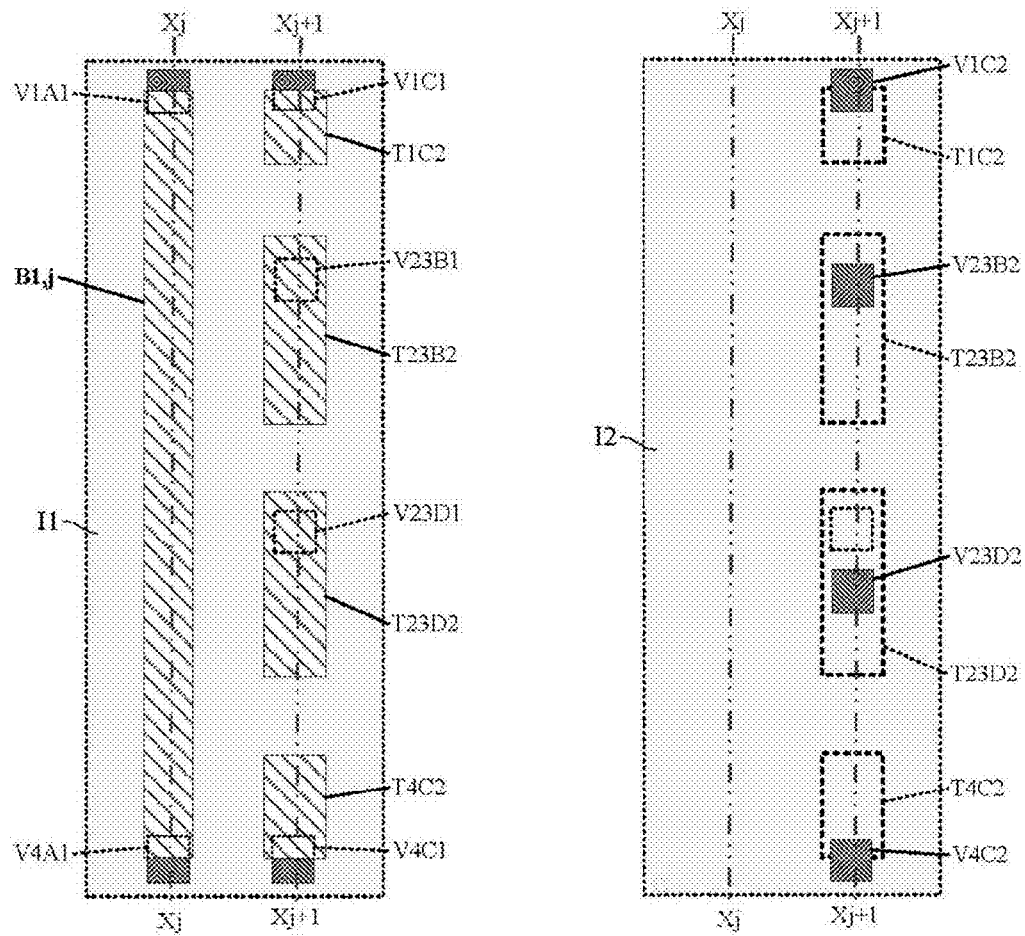

During a step E4 illustrated in FIG. 11, a metal layer is deposited on the dielectric layer I1 then is etched or chemically and mechanically polished to obtain the sections of conductive tracks of level M2 ('metal 2') mentioned in Table 1. Each section of conductive track extends above the level 1 via which is mentioned in Table 1. The section of conductive track made above the vias V1A1 and V4A1 forms the bitline B1,j. The bitline therefore extends beyond the building block represented, over the entire length of the column of memory cells.

During a step E5 illustrated in FIG. 12A, a dielectric layer I2 is deposited on the substrate, and the level 2 vias mentioned in Table 1 are made in the layer I2. Each via extends above the section of conductive track of level M2 which is mentioned in Table 1. The position of the via relative to the axes Xj, Xj+1 is as previously given in Table 1.

Figure 12B:
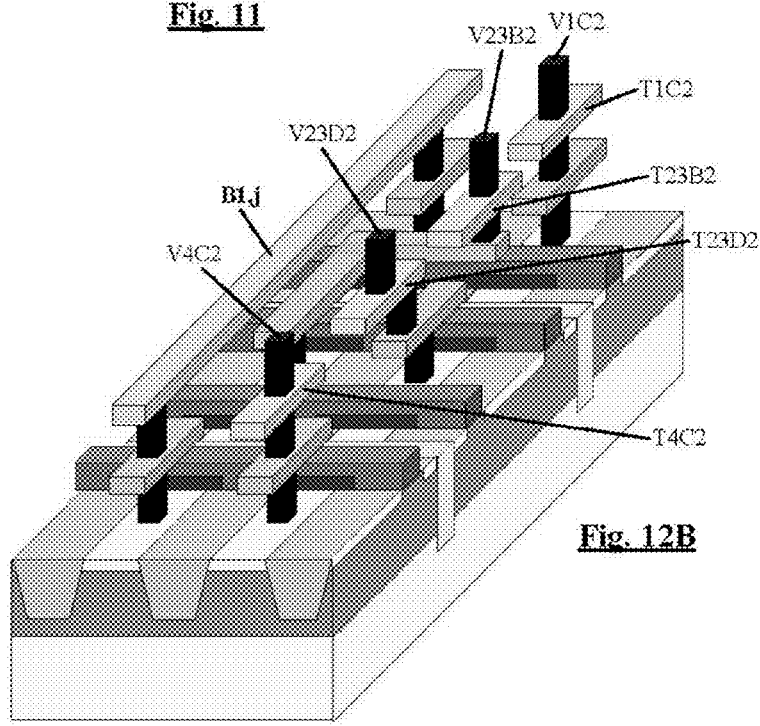

FIG. 12B is a schematic view in perspective and in section of the substrate showing the sections of tracks and vias made during steps E4, E5 and those previously made. The dielectric layers I0, I1, I2 are not represented for the sake of visibility of the other elements represented.

Figure 13:
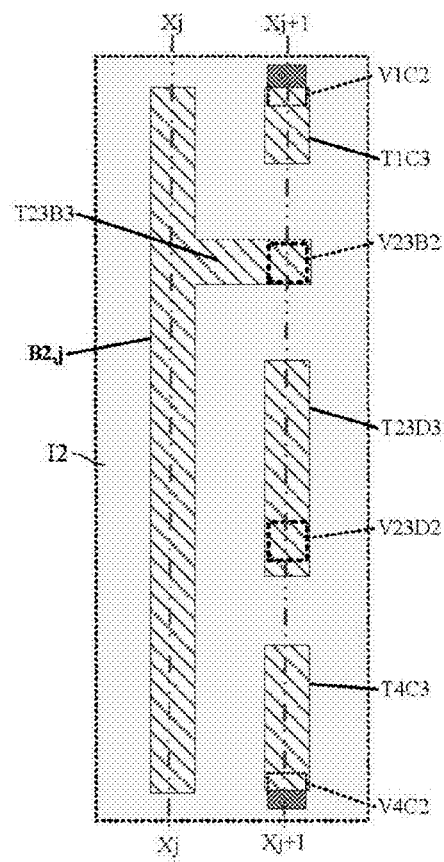

During a step E6 illustrated in FIG. 13, a metal layer is deposited on the dielectric layer I2 then is etched or chemically and mechanically polished to obtain the sections of conductive tracks of level M3 ('metal 3') mentioned in Table 1. Each section of conductive track extends above the level 2 via which is mentioned in Table 1. The section of conductive track made above the via V23B2 includes a first transverse section T23B3 which passes from the axis Xj+1 to the axis Xj and a longitudinal section aligned on the axis Xj and forming the bitline B2,j. The bitline therefore extends beyond the building block represented, over the entire length of the column of memory cells.

Figure 14A:
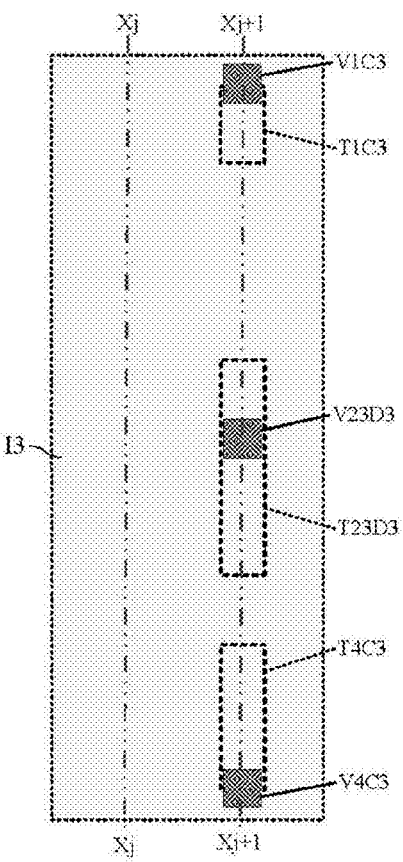

During a step E7 illustrated in FIG. 14A, a dielectric layer I3 is deposited on the substrate, and the level 3 vias mentioned in Table 1 are made in the layer I3. Each via extends above the section of conductive track of level M3 which is mentioned in Table 1. The position of the via relative to the axes Xj, Xj+1 is as previously given in Table 1.

Figure 14B:
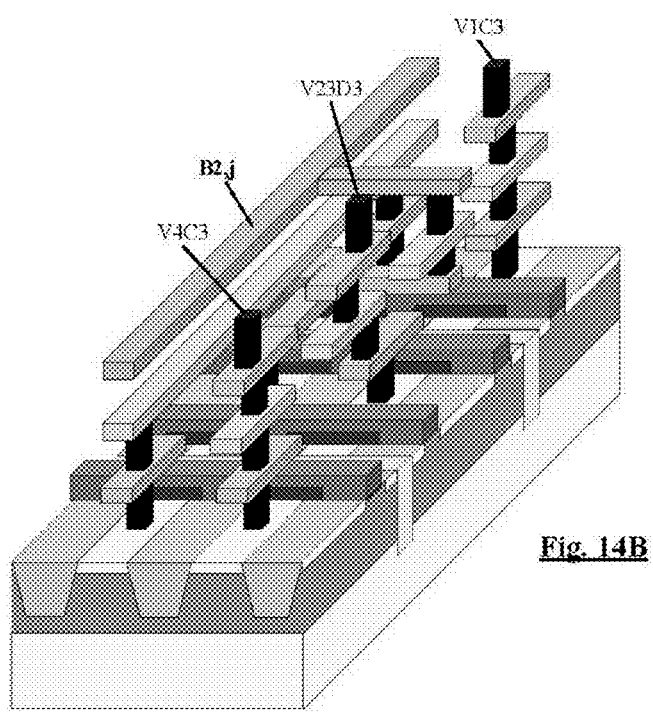

FIG. 14B is a schematic view in perspective and in section of the substrate showing the sections of tracks and vias made during steps E6, E7 and those previously made. The dielectric layers I0, I1, I2, I3 are not represented for the sake of visibility of the other elements represented.

Figure 15:
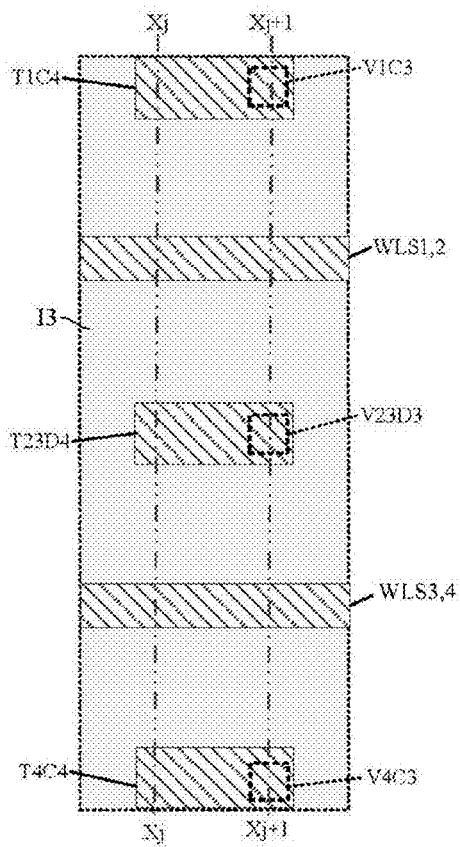

During a step E8 illustrated in FIG. 15, a metal layer is deposited on the dielectric layer I3 then is etched or chemically and mechanically polished to obtain the sections of conductive tracks of level M4 ('metal 4') mentioned in Table 1. Each section of conductive track extends above the level 3 via which is mentioned in Table 1. The three sections of conductive track made here are arranged transversely to the axes Xj, Xj+1 and therefore appear in both of the columns 'Xj' and 'Xj+1' in Table 1.

Step E8 may optionally include the creation of conductive tracks WLS1,2, WLS3,4 which pass through the memory plane transversely to the axes Xj, Xj+1 and are connected from time to time to the wordlines WLS1,2, WLS3,4 for reducing their linear resistance, these connections being outside the scope of FIG. 15. Other functional conductive tracks of this type, not involved in connecting the memory cells to the bitlines, e.g., tracks connected to the gate control lines CGL1 to CGL4, may be made at the same time as the sections of tracks aimed at connecting the memory cells to the bitlines.

Figure 16A:
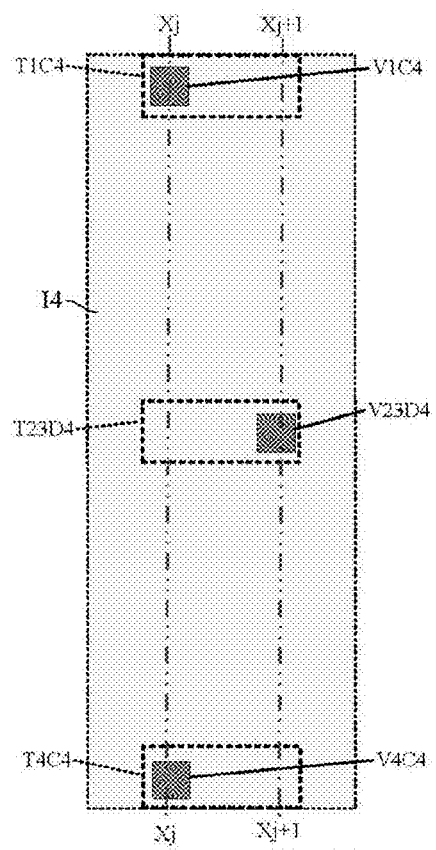

During a step E9 illustrated in FIG. 16A, a dielectric layer I4 is deposited on the substrate, and the level 4 vias mentioned in Table 1 are made in the layer I4. Each via extends above the section of conductive track of level M4 which is mentioned in Table 1. The position of the via relative to the axes Xj, Xj+1 is as previously given in Table 1.

Figure 16B:
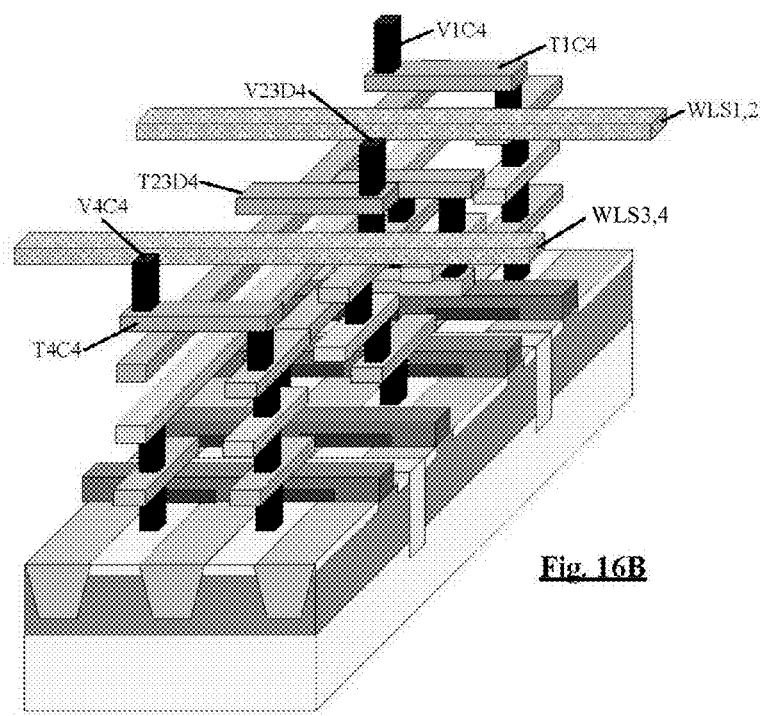

FIG. 16B is a schematic view in perspective and in section of the substrate showing the sections of tracks and vias made during steps E8, E9 and those previously made. The dielectric layers I0, I1, I2, I3, I4 are not represented for the sake of visibility of the other elements represented.

During a step E10 illustrated in FIG. 17A, a metal layer is deposited on the dielectric layer I4 then is etched or chemically and mechanically polished to obtain the bitlines B1,j+1, B2,j+1 mentioned in Table 1. The bitline B1,j+1 is in contact with the vias V1C4 and V4C4 and the bitline B2,j+1 is in contact with the via V23D4.

FIG. 17B is a schematic view in perspective and in section of the substrate showing all the vias and sections of tracks made. As previously, the various dielectric layers are not represented for the sake of visibility of the other elements represented.

Table 1 shows how the drain regions of the floating gate transistors are connected to the bitlines via all the vias and sections of tracks made. Table 1 and the figures previously described also show that the bitlines B1,j, B2,j and B1,j+1 are superimposed, the latter being created respectively on levels M2, M3 and M5 and aligned on the axis Xj. Only the bitline B2,j+1 made on level M5 is aligned on the axis Xj+1.

This method of fabrication therefore benefits from the advantages in terms of space requirement offered by twin memory cells having a common buried vertical selection gate (control gate of the selection transistors thereof), while making it possible to read the memory cells individually thanks to the provision of two bitlines per column, without penalizing the space requirement of the memory plane. The method is capable of diverse variants with regard to the routing of bitline sections and the arrangement of vias, as well as the materials used for producing these elements.

Figure 18:
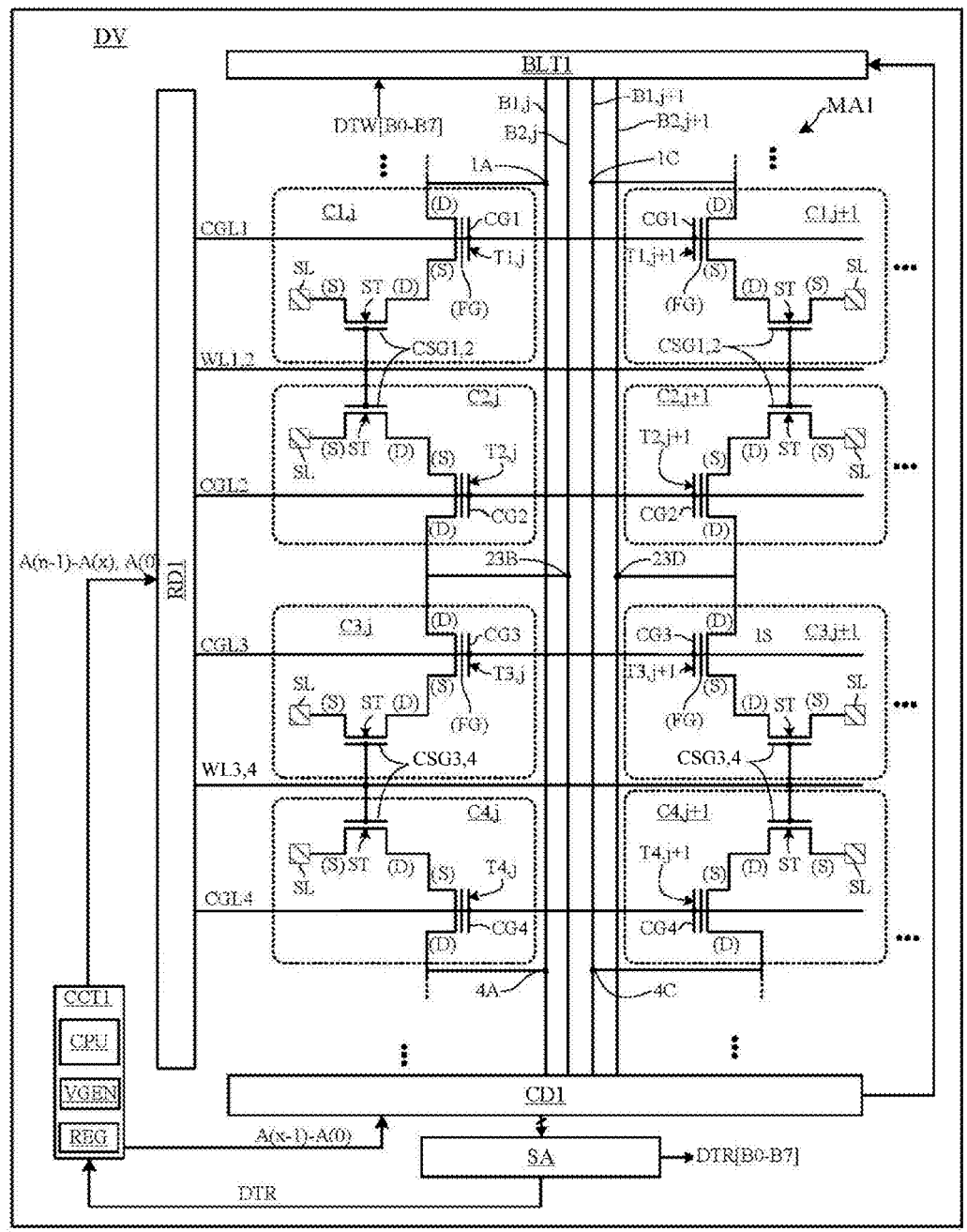
FIG. 18 is the electrical diagram of a memory including the memory plane in FIG. 2.

FIG. 18 is an electrical diagram of an integrated circuit device DV including the memory plane MA1 of FIG. 2. The device DV includes a control circuit CCT1, a wordline decoder RD1, a column decoder CD1, reading amplifiers SA equal in number to the number of bits in a word to be read in the memory plane, e.g., a word of eight bits B0-B7, and programming latches BLT1 for applying voltages to the bitlines B1,j, B2,j, B1,j+1, B2,j+1, according to a word DTW to be written in the memory, e.g., a word of eight bits B0-B7.

The wordline decoder RD1 controls the voltages applied to the gate control lines CGL1 to CGL4 and to the wordline WL1,2, WL3,4 according to a most significant address A(n−1)-A(x) of a word, or line address. The decoder CD1, in combination with the latches BLT1, controls the voltages applied to the bitlines B1,j, B2,j, B1,j+1, B2,j+1 according to a least significant address A(x−1)-A(0) of the word, or column address, the line and column addresses together forming the address A(n−1)-A0 of a word to be read or to be written in the memory plane. In reading mode, the decoder CD1 connects the reading amplifiers SA to the bitlines connected to the memory cells that have to be read, and the reading amplifiers provide the word DTR.

The circuit CCT1 includes, for example, a central processing unit CPU, a voltage generator VGEN, and address and data registers REG. It executes read or write commands, controls the decoders, supplies the voltages necessary to the read or write operations (erasing-programming), supplies most significant and least significant addresses to the decoders, and if necessary executes a program for refreshing the memory cells.

Because of the presence of two bitlines per column, the wordline decoder RD1 is configured to be able to separately control the voltages applied to the gate control lines of twin memory cells, i.e., CGL1, CGL2 or CGL3, CGL4 which here have the same most significant address A(n−1)-A(x). This separate control of the voltages may be reserved to erasure operations, for applying a positive voltage to those memory cells located on a page that is the twin of that containing the memory cell or cells being erased. In reading mode, the decoder may on the other hand apply the same voltage to the twin gate control lines or even to all the gate control lines of the memory plane to limit the switching of logic gates and therefore reduce the electrical consumption of the memory, since the selection of memory cells in reading is ensured by means of the wordlines WL. In such an embodiment, the decoder RD1 receives, in addition to the most significant address A(n−1)A(x) of a word, the least significant bit A(0) of the least significant address A(x−1)-A(0) of the word. The decoder RD1 also receives from the circuit CCT1 an information signal which tells it whether the address decoding to be performed is taking place as part of a reading, an erasure or a programming of memory cells. If the decoding is taking place as part of an erasure, the decoder RD1 differentiates the two gate control lines, according to the bit A(0). For example, the decoder RD1 selects the gate control line CGL1 if the bitline B1,j is designated by the complete address received by the memory, or selects the gate control line CGL2 if the bitline B2,j is designated by the complete address received by the memory. In an equivalent variant, the decoder may receive a signal from the column decoder CD1 telling it which of the two gate control lines to be selected. The person skilled in the art could naturally provide other embodiments of the decoder, e.g., to separately control the voltages applied to the gate control lines of twin memory cells in reading, programming and erasure.

ANNEX

TABLE 1 forming an integral part of the description

| | | | Conductive Path | | | | | |
|---|---|---|---|---|---|---|---|---|
| | | | 1A | | 23B | | 4A | |
| | | | | | Axis of bitline | | | |
| | | | Axis Xj | Axis Xj + 1 | Axis Xj | Axis Xj + 1 | Axis Xj | Axis Xj + 1 |
| | | | | | Drain region | | | |
| FIG.(S) | Step | Level | D(T1, j) | | D(T2, j, T3, j) | | D(T4, j) | |
| 8A, 8B | E1 | 0 | V1A0 | | V23B0 | | V4A0 | |
| 9 | E2 | M1 | T1A1 | | T23B1 | T23B1 | T4A1 | |
| 10A, 10B | E3 | 1 | V1A1 | | | V23B1 | V4A1 | |
| 11 | E4 | M2 | B1, j | | | T23B2 | B1, j | |
| 12A, 12B | E5 | 2 | | | | V23B2 | | |
| 13 | E6 | M3 | | | B2, j | T23B3 | | |
| 14A, 14B | E7 | 3 | | | | | | |
| 15 | E8 | M4 | | | | | | |
| 16A, 16B | E9 | 4 | | | | | | |
| 17A, 17B | E10 | M5 | | | | | | |

| | Conductive Path | | | | | |
|---|---|---|---|---|---|---|
| | 1C | | 23D | | 4C | |
| | | | Axis of bitline | | | |
| | Axis Xj | Axis Xj + 1 | Axis Xj | Axis Xj + 1 | Axis Xj | Axis Xj + 1 |
| | | | Drain region | | | |
| FIG.(S) | D(T1, j + 1) | | D(T2, j + 1, T3, j + 1) | | D(T4, j + 1) | |
| 8A, 8B | V1C0 | | V23D0 | | V4C0 | |
| 9 | T1C1 | | T23D1 | | T4C1 | |
| 10A, 10B | V1C1 | | V23D1 | | V4C1 | |
| 11 | T1C2 | | T23D2 | | T4C2 | |
| 12A, 12B | V1C2 | | V23D2 | | V4C2 | |
| 13 | T1C3 | | T23D3 | | T4C3 | |
| 14A, 14B | V1C3 | | V23D3 | | V4C3 | |
| 15 | T1C4 | T1C4 | T23D4 | T4C4 | T4C4 | |
| 16A, 16B | V1C4 | | V23D4 | V4C4 | | |
| 17A, 17B | B1, j + 1 | | B2, j + 1 | B1, j + 1 | | |

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-volatile memory, comprising:
a first twin pair of memory cells, the first twin pair including first and second memory cells arranged in a first column, the first and second memory cells each including a respective selection transistor and a respective floating gate transistor, the selection transistors of the first twin pair having respective gate terminals coupled to one another;
a second twin pair of memory cells, the second twin pair including third and fourth memory cells arranged in a second column, the third memory cell being adjacent to the first memory cell, the fourth memory cell being adjacent to the second memory cell, the third and fourth memory cells each including a respective selection transistor and a respective floating gate transistor, the selection transistors of the second twin pair having respective gate terminals coupled to one another;
a first bitline coupled to a conduction terminal of the floating gate transistor of the first memory cell;
a second bitline coupled to a conduction terminal of the floating gate transistor of the second memory cell;
a third bitline coupled to a conduction terminal of the floating gate transistor of the third memory cell;
a fourth bitline coupled to a conduction terminal of the floating gate transistor of the fourth memory cell, the first, second, third, and fourth bitlines being different from one another; and
a first word line coupled to the gate terminals of the selection transistors of the first and second twin pairs.

2. The non-volatile memory of claim 1, comprising:
a third twin pair of memory cells, the third twin pair including fifth and sixth memory cells arranged in the first column, the fifth and sixth memory cells each including a respective selection transistor and a respective floating gate transistor, the selection transistors of the third twin pair having respective gate terminals coupled to one another;

a fourth twin pair of memory cells, the fourth twin pair including seventh and eighth memory cells arranged in the second column, the seventh memory cell being adjacent to the fifth memory cell, the eighth memory cell being adjacent to the sixth memory cell, the seventh and eighth memory cells each including a respective selection transistor and a respective floating gate transistor, the selection transistors of the fourth twin pair having respective gate terminals coupled to one another; and a second word line coupled to the gate terminals of the selection transistors of the third and fourth twin pairs, wherein the first bitline is coupled to a conduction terminal of the floating gate transistor of the sixth memory cell, the second bitline is coupled to a conduction terminal of the floating gate transistor of the fifth memory cell, the third bitline is coupled to a conduction terminal of the floating gate transistor of the eighth memory cell and the fourth bitline is coupled to a conduction terminal of the floating gate transistor of the seventh memory cell.

3. The non-volatile memory of claim 2 comprising:
a first gate control line coupled to respective control gates of the floating gate transistors of the first and third memory cells;
a second gate control line coupled to respective control gates of the floating gate transistors of the second and fourth memory cells;
a third gate control line coupled to respective control gates of the floating gate transistors of the fifth and seventh memory cells; and
a fourth gate control line coupled to respective control gates of the floating gate transistors of the sixth and eighth memory cells.

4. The non-volatile memory of claim 2, wherein the first, second and third bitlines are arranged over the first column of memory cells, and the fourth bitline is arranged over the second column of memory cells.

5. The non-volatile memory of claim 2, comprising:
an electrically isolating layer between the memory cells and the first through fourth bitlines;
a first conductive path coupling the first bitline to the conduction terminals of the floating gate transistors of the first and sixth memory cells, the first conductive path being routed through at least a portion of the electrically isolating layer;
a second conductive path coupling the second bitline to the conduction terminals of the floating gate transistors of the second and fifth memory cells, the second conductive path being routed through at least a portion of the electrically isolating layer;
a third conductive path coupling the third bitline to the conduction terminals of the floating gate transistors of the third and eighth memory cells, the third conductive path being routed through at least a portion of the electrically isolating layer; and
a fourth conductive path coupling the fourth bitline to the conduction terminals of the floating gate transistors of the fourth and seventh memory cells, the fourth conductive path being routed through at least a portion of the electrically isolating layer.

6. The non-volatile memory of claim 5, the electrically isolating layer comprising first, second, third, fourth and fifth isolating layers, wherein:

the first bitline extends over the second isolating layer;
the second bitline extends over the third isolating layer;
the third bitline extends over the fifth isolating layer; and
the fourth bitline extends over the fifth isolating layer.

7. The non-volatile memory according of claim 6, the first conductive path comprising:
a first via extending through the first isolating layer;
a first section of conductive line positioned on the first isolating layer and extending in a direction parallel to the first column of memory cells; and
a second via extending through the second isolating layer.

8. The non-volatile memory of claim 6, the second conductive path comprising:
a first via extending through the first isolating layer;
a first section of conductive line positioned on the first isolating layer and extending in a direction transverse to the first and second columns of memory cells;
a second via extending through the second isolating layer;
a second section of conductive line positioned on the second isolating layer and extending in a direction parallel to the second column of memory cells;
a third via extending through the third isolating layer; and
a third section of conductive line positioned on the third isolating layer and extending in a direction transverse to the first and second columns of memory cells.

9. The non-volatile memory of claim 6, the third conductive path comprising:
a first via extending through the first isolating layer,
a first section of conductive line positioned on the first isolating layer and extending in a direction parallel to the second column of memory cells;
a second via extending through the second isolating layer;
a second section of conductive line positioned on the second isolating layer and extending in a direction parallel to the second column of memory cells;
a third via extending through the third isolating layer;
a third section of conductive line positioned on the third isolating layer and extending in a direction parallel to the second column of memory cells;
a fourth via extending through the fourth isolating layer;
a fourth section of conductive line positioned on the fourth isolating layer and extending in a direction transverse to the first and second columns of memory cells; and
a fifth via extending through the fifth isolating layer.

10. The non-volatile memory of claim 6, the fourth conductive path comprising:
a first via extending through the first isolating layer;
a first section of conductive line positioned on the first isolating layer and extending in a direction parallel to the second column of memory cells;
a second via extending through the second isolating layer;
a second section of conductive line positioned on the second isolating layer and extending in a direction parallel to the second column of memory cells;
a third via extending through the third isolating layer;
a third section of conductive line positioned on the third isolating layer and extending in a direction parallel to the second column of memory cells;
a fourth via extending through the fourth isolating layer;
a fourth section of conductive line positioned on the fourth isolating layer and extending in a direction transverse to the first and second columns of memory cells; and
a fifth via extending through the fifth isolating layer.

11. The non-volatile memory of claim 1, further comprising a reading circuit and a column decoder, the reading circuit and column decoder being configured to read the memory cells.

12. A method, comprising:
forming first and second memory cells in a first column, the first and second memory cells each including a respective selection transistor and a respective floating gate transistor;
coupling respective gate terminals of the selection transistors of the first and second memory cells to one another;
forming third and fourth memory cells in a second column, adjacent to the first column, the third and fourth memory cells each including a respective selection transistor and a respective floating gate transistor;
coupling respective gate terminals of the selection transistors of the third and fourth memory cells to one another;
forming first, second, third and fourth bitlines, the first, second, third and fourth bitlines being different from one another;
coupling the first bitline to a conduction terminal of the floating gate transistor of the first memory cell;
coupling the second bitline to a conduction terminal of the floating gate transistor of the second memory cell;
coupling the third bitline to a conduction terminal of the floating gate terminal of the third memory cell; and
coupling the fourth bitline to a conduction terminal of the floating gate transistor of the fourth memory cell.

13. The method of claim 12, further comprising:
coupling a first word line to the gate terminals of the selection transistors of the first, second, third and fourth memory cells.

14. The method of claim 13, further comprising:
forming fifth and sixth memory cells in the first column, the fifth and sixth memory cells each including a respective selection transistor and a respective floating gate transistor, the fifth memory cell being adjacent to the second memory cell in the first column;
coupling respective gate terminals of the selection transistors of the fifth and sixth memory cells to one another;
forming seventh and eight memory cells in the second column, the seventh and eighth memory cells each including a respective selection transistor and a respective floating gate transistor, the seventh memory cell being adjacent to the fourth memory cell in the second column;
coupling respective gate terminals of the selection transistors of the seventh and eighth memory cells to one another;
coupling the first bitline to a conduction terminal of the floating gate transistor of the sixth transistor;
coupling the second bitline to a conduction terminal of the floating gate transistor of the fifth memory cell;
coupling the third bitline to a conduction terminal of the floating gate transistor of the eighth memory cell;
coupling the fourth bitline to a conduction terminal of the floating gate transistor of the seventh memory cell; and
coupling a second word line to the gate terminals of the selection transistors of the fifth, sixth, seventh and eighth memory cells.

15. The method of claim 12, further comprising:
forming first, second, third, fourth and fifth isolating layers;
forming the first bitline on the second isolating layer, the first bitline being arranged over the first column of memory cells;
forming the second bitline on the third isolating layer, the second bitline being arranged over the first column of memory cells;
forming the third bitline on the fifth isolating layer, the third bitline being arranged over the first column of memory cells; and
forming the fourth bitline on the fifth isolating layer, the fourth bitline being arranged over the second column of memory cells.

16. A non-volatile memory, comprising:
a first column of memory cells, the first column including first and second memory cells each including a respective selection transistor and a respective floating gate transistor, the selection transistors of the first and second memory cells having respective gate terminals coupled to one another;
a second column of memory cells, the second column including third and fourth memory cells, the third memory cell being adjacent to the first memory cell, the fourth memory cell being adjacent to the second memory cell, the third and fourth memory cells each including a respective selection transistor and a respective floating gate transistor, the selection transistors of the third and fourth memory cells having respective gate terminals coupled to one another;
a first bitline coupled to a conduction terminal of the floating gate transistor of the first memory cell;
a second bitline coupled to a conduction terminal of the floating gate transistors of the second memory cell;
a third bitline coupled to a conduction terminal of the floating gate transistor of the third memory cell; and
a fourth bitline coupled to a conduction terminal of the floating gate transistor of the fourth memory cell, the first, second, third, and fourth bitlines being different from one another.

17. The non-volatile memory of claim 16 wherein the first, second and third bitlines are arranged over the first column of memory cells, and the fourth bitline is arranged over the second column of memory cells.

18. The non-volatile memory of claim 17, comprising:
fifth and sixth memory cells arranged in the first column, the fifth and sixth memory cells each including a respective selection transistor and a respective floating gate transistor, the selection transistors of the fifth and sixth memory cells having respective gate terminals coupled to one another;
seventh and eighth memory cells arranged in the second column, the seventh memory cell being adjacent to the fifth memory cell, the eighth memory cell being adjacent to the sixth memory cell, the seventh and eighth memory cells each including a respective selection transistor and a respective floating gate transistor, the selection transistors of the seventh and eighth memory cells having respective gate terminals coupled to one another,
wherein the first bitline is coupled to a conduction terminal of the floating gate transistor of the sixth memory cell, the second bitline is coupled to a conduction terminal of the floating gate transistor of the fifth memory cell, the third bitline is coupled to a conduction terminal of the floating gate transistor of the eighth memory cell and the fourth bitline is coupled to a conduction terminal of the floating gate transistor of the seventh memory cell.

19. The non-volatile memory of claim 18, comprising:
a first gate control line coupled to respective control gates of the floating gate transistors of the first and third memory cells;
a second gate control line coupled to respective control gates of the floating gate transistors of the second and fourth memory cells;
a third gate control line coupled to respective control gates of the floating gate transistors of the fifth and seventh memory cells; and
a fourth gate control line coupled to respective control gates of the floating gate transistors of the sixth and eighth memory cells.

20. The non-volatile memory of claim 18, comprising:
an electrically isolating layer positioned between the memory cells and the first through fourth bitlines;
a first conductive path coupling the first bitline to the conduction terminals of the floating gate transistors of the first and sixth memory cells, the first conductive path being routed through at least a portion of the electrically isolating layer;
a second conductive path coupling the second bitline to the conduction terminals of the floating gate transistors of the second and fifth memory cells, the second conductive path being routed through at least a portion of the electrically isolating layer;
a third conductive path coupling the third bitline to the conduction terminals of the floating gate transistors of the third and eighth memory cells, the third conductive path being routed through at least a portion of the electrically isolating layer; and
a fourth conductive path coupling the fourth bitline to the conduction terminals of the floating gate transistors of the fourth and seventh memory cells, the fourth conductive path being routed through at least a portion of the electrically isolating layer.

* * * * *